United States Patent
Leem

(10) Patent No.: US 9,466,339 B2
(45) Date of Patent: Oct. 11, 2016

(54) SEMICONDUCTOR MEMORY DEVICE AND METHOD OF OPERATING THE SAME

(71) Applicant: SK hynix Inc., Gyeonggi-do (KR)

(72) Inventor: Jong Soon Leem, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 49 days.

(21) Appl. No.: 14/587,229

(22) Filed: Dec. 31, 2014

(65) Prior Publication Data

US 2015/0117123 A1    Apr. 30, 2015

Related U.S. Application Data

(62) Division of application No. 13/599,706, filed on Aug. 30, 2012, now Pat. No. 8,953,381.

(30) Foreign Application Priority Data

Oct. 24, 2011 (KR) ........................ 10-2011-0108885

(51) Int. Cl.
| | | |
|---|---|---|
| G11C 16/10 | (2006.01) | |
| G11C 16/04 | (2006.01) | |
| G11C 16/08 | (2006.01) | |
| G11C 7/00 | (2006.01) | |
| G11C 8/08 | (2006.01) | |
| G11C 16/26 | (2006.01) | |
| G11C 11/56 | (2006.01) | |

(52) U.S. Cl.
CPC . *G11C 7/00* (2013.01); *G11C 8/08* (2013.01); *G11C 16/0483* (2013.01); *G11C 16/08* (2013.01); *G11C 16/10* (2013.01); *G11C 16/26* (2013.01); *G11C 11/5628* (2013.01)

(58) Field of Classification Search
CPC .............. G11C 16/10; G11C 16/0483; G11C 11/5628; G11C 8/08

USPC ............. 365/185.17, 185.18, 189.19, 185.23
See application file for complete search history.

(56) References Cited

U.S. PATENT DOCUMENTS

| | | | | |
|---|---|---|---|---|
| 8,902,656 B2* | 12/2014 | Chen | ............... | G11C 16/0483 365/185.03 |
| 2005/0128810 A1* | 6/2005 | Lutze | ................ | G11C 16/3418 365/185.17 |
| 2007/0109862 A1* | 5/2007 | Kim | ....................... | G11C 8/08 365/185.19 |
| 2008/0186776 A1* | 8/2008 | Kim | ................... | G11C 16/0483 365/185.23 |
| 2009/0257281 A1* | 10/2009 | Lee | .................... | G11C 16/3454 365/185.19 |
| 2010/0097863 A1* | 4/2010 | Kim | .................... | G11C 11/5628 365/185.18 |
| 2010/0284213 A1* | 11/2010 | Savransky | .......... | G11C 11/5678 365/163 |
| 2010/0329010 A1* | 12/2010 | Dong | ................... | G11C 11/5628 365/185.17 |
| 2011/0026331 A1* | 2/2011 | Dong | ................ | G11C 16/0483 365/185.19 |
| 2012/0033501 A1* | 2/2012 | Park | .................... | G11C 11/5642 365/185.19 |
| 2012/0081963 A1* | 4/2012 | Dutta | ....................... | G11C 7/02 365/185.17 |
| 2012/0120727 A1* | 5/2012 | Kim | .................... | G11C 11/5642 365/185.17 |
| 2013/0301337 A1* | 11/2013 | Kamalanathan | ... | G11C 13/0002 365/148 |

* cited by examiner

*Primary Examiner* — Ly D Pham
(74) *Attorney, Agent, or Firm* — IP & T Group LLP

(57) ABSTRACT

A semiconductor memory device includes a memory cell array having memory cells coupled to a plurality of word lines and a peripheral circuit group configured to supply a pass voltage to unselected word lines among the plurality of word lines, wherein the peripheral circuit group stepwise raises the pass voltage supplied to the unselected word lines to a target level.

10 Claims, 5 Drawing Sheets

SEMICONDUCTOR MEMORY DEVICE AND METHOD OF OPERATING THE SAME

CROSS-REFERENCE TO RELATED APPLICATION

This application is a division of U.S. patent application Ser. No. 13/599,706 filed on Aug. 30, 2012, which claims priority to Korean patent application number 10-2011-0108885 filed on Oct. 24, 2011. The disclosure of each of the foregoing application is incorporated by reference herein in its entirety.

BACKGROUND

Exemplary embodiments of this disclosure relate to a semiconductor memory device and a method of operating the same.

A semiconductor memory device includes a cell array having a number of memory cells for storing data. The cell array includes a plurality of cell strings. Each of the cell strings includes two selection transistors and memory cells coupled in series between them. Furthermore, word lines are coupled to the gates of the respective memory cells of each of the cell strings.

When the memory cells are programmed, a program voltage is supplied to a selected word line and a pass voltage is supplied to the remaining unselected word lines.

At this time, there may be a memory cell that should not be programmed, from among memory cells coupled to the same word line. For this reason, a self-boosting method is employed in order to boost the channel voltage of a cell string coupled to a memory cell which should not be programmed.

In the self-boosting method employed in a program operation, 0 V is supplied to a bit line coupled to a memory cell to be programmed from among bit lines coupled to respective cell strings, and a power source voltage is supplied to a bit line coupled to a memory cell to be program-inhibited from among the bit lines. Furthermore, select transistors coupled between the bit lines and the cell strings are turned on, and the remaining selection transistors are turned off.

Assuming that the memory cells are in an erase state prior to the program operation and the power source voltage has been supplied to a bit line, the channel of the cell string coupled to the bit line is precharged to the difference between the power source voltage and the threshold voltage of the selection transistor.

Furthermore, when the program voltage is supplied to the selected word line and the pass voltage is supplied to the unselected word lines, the channel voltage of the precharge state rises, and thus the selection transistors are turned off according to the difference between the voltage of the bit line and the channel voltage. As a result, the channel is floated, and the channel voltage is further boosted by the program voltage. The channel of the cell string coupled to the memory cell to be programmed and to the bit line supplied with 0 V maintains 0 V. As a result, the memory cell to be programmed is programmed depending on the difference between the channel voltage of 0 V and the program voltage supplied to the selected word line.

Furthermore, in case of the memory cell to be program-inhibited, the channel voltage of the relevant cell string is highly boosted, and thus the difference between the channel voltage and the program voltage supplied to the selected word line is significantly reduced so that the memory cell is program-inhibited.

In the self-boosting method, one of important factors is the pass voltage supplied to the unselected word lines. A program inhibition effect may be increased because the significantly higher channel voltage is generated by the self-boosting as the higher pass voltage is supplied.

If a too high channel voltage is generated, however, a pass disturbance phenomenon, in which the memory cells coupled to the unselected word lines are undesirably programmed, may be generated. For this reason, a proper pass voltage must be supplied in order to maximize a program effect and reduce the pass disturbance phenomenon.

Furthermore, even when data is read out from a memory cell programmed as described above, a pass voltage is supplied to unselected word lines. Accordingly, a pass disturbance phenomenon may be generated because of the pass voltage.

BRIEF SUMMARY

Exemplary embodiments relate to a semiconductor memory device and a method of operating the same, in which a pass voltage supplied to unselected word lines in a program or read operation is raised in a stepwise manner.

A semiconductor memory device according to an aspect of the present disclosure includes a memory cell array having memory cells coupled to a plurality of word lines and a peripheral circuit group configured to supply a pass voltage to unselected word lines, wherein the peripheral circuit group stepwise raises the pass voltage supplied to the unselected word lines to a target level.

A method of operating a semiconductor memory device according to an aspect of the present disclosure includes performing a program operation by supplying a program voltage to a selected word line and a pass voltage to unselected word lines in response to a program command, wherein the pass voltage supplied to the unselected word lines include at least two voltage levels and is supplied in a stepwise pulse form whenever the program operation is performed.

A method of operating a semiconductor memory device according to another aspect of the present disclosure includes setting a bit line voltage in response to a program command, supplying a first voltage to a selected word line and a second voltage lower than the first voltage to unselected word lines, and adjusting the first voltage to increase to a third voltage and the second voltage to increase to the first voltage.

A method of operating a semiconductor memory device according to yet another aspect of the present disclosure includes performing a read operation by supplying a read voltage to a selected word line and a pass voltage to unselected word lines in response to a read command, wherein the pass voltage supplied to the unselected word lines is raised to a target level in a stepwise pulse form.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
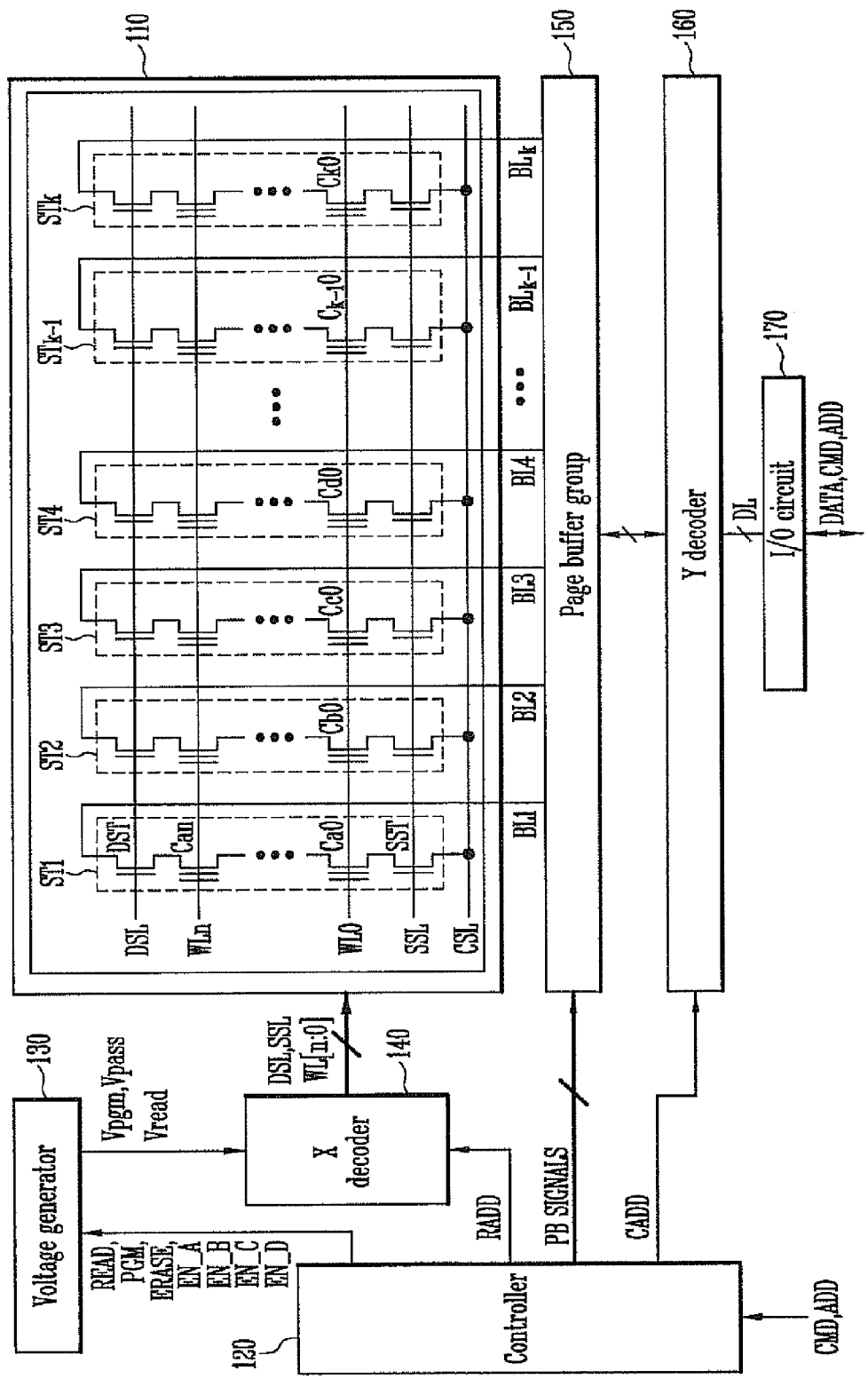
FIG. 1 is a schematic diagram of a semiconductor memory device according to an exemplary embodiment of this disclosure.

FIG. 1 is a schematic diagram of a semiconductor memory device according to an exemplary embodiment of this disclosure.

Referring to FIG. 1, the semiconductor memory device 100 includes a memory array 110, an operation circuit group 130, 140, 150, 160, and 170 configured to perform a program operation or read operation on memory cells included in the memory cell array 110, and a controller 120 configured to control the operation circuit group 130, 140, 150, 160, and 170.

The operation circuit group includes a voltage generator 130, an X decoder 140, a page buffer group 150, a Y decoder 160, and an input/output (I/O) circuit 170.

The memory cell array 110 includes a plurality of memory blocks, although, for the illustrative purpose, only one of the memory blocks is shown in FIG. 1. The memory block includes a plurality of strings ST1 to STk. Each of the strings, for example, ST1, includes a source selection transistor SST coupled to a common source line CSL, a plurality of memory cells Ca0 to Can, and a drain selection transistor DST coupled to a bit line BL1. The gate of the source selection transistor SST is coupled to a source selection line SSL, and the gates of the memory cells Ca0 to Can are coupled to respective word lines WL0 to WLn. The gate of the drain selection transistor DST is coupled to a drain selection line DSL. The strings ST1 to STk are coupled the respective bit lines BL1 to $BL_k$ and are coupled to the common source line CSL in common.

The memory block may be divided according to each physical page or logical page. The page (or an even page and an odd page) is a basic unit for a program operation or a read operation.

For example, the memory cells Ca0 to Ck0 coupled to a single word line, for example, WL0, form a single physical page. Furthermore, even-numbered memory cells Ca0, Cc0, ..., Ck-10 coupled a single word line, for example, WL0, may form a single even physical page, and odd-numbered memory cells Cb0, Cd0, ..., Ck0 coupled to the word line WL0 may form a single odd physical page.

The controller 120 internally generates a program operation signal PGM, a read operation signal READ, or an erase operation signal ERASE in response to an external command signal CMD and generates control signals PB SIGNALS for controlling the page buffers of the page buffer group 150 according to a type of an operation. Furthermore, the controller 120 internally generates a row address signal RADD and a column address signal CADD in response to an address signal ADD. The controller 120 also generates enable signals EN_A, EN_B, EN_C, and EN_D for selecting operating voltages supplied to global word lines, from among operating voltages generated from the voltage generator 130.

The controller 120 of FIG. 1 is illustrated as generating the four enable signals EN_A, EN_B, EN_C, and EN_D, but the number of enable signals may be increased depending on the number of operating voltages.

The voltage generator 130 generates the operating voltages, for example, Vpgm, Vpass, R1, and new_R1, for programming, reading, or erasing memory cells in response to the operation signals PGM, READ, and ERASE, that is, the internal command signals of the controller 120 and selects the operating voltages to be supplied to the respective global lines in response to a control signal generated from the controller 120.

In an exemplary embodiment of this disclosure, the pass voltage Vpass, from among the operating voltages generated from the voltage generator 130, is supplied in a stepwise increase form. This will be described in detail hereinafter.

The X decoder 140 transfers the operating voltages of the voltage generator 130 to the local lines DSL, WL[n:0], and SSL of a memory block, selected from the memory blocks of the memory array 110, in response to the row address signals RADD of the controller 120.

The page buffer group 150 includes the page buffers (not shown) coupled to the respective bit lines BL1 to $BL_k$. The page buffer group 150 supplies voltage necessary to store data in the memory cells Ca0, ..., Ck0 to each of the bit lines BL1 to $BL_k$ in response to the control signals PB SIGNALS of the controller 120. More specifically, the page buffer group 150 precharges the bit lines BL1 to $BL_k$ or latches data corresponding to the threshold voltages of the memory cells Ca0, ..., Ck0, detected based on a shift in the voltages of the bit lines BL1 to $BL_k$, when a program operation, an erase operation, or a read operation is performed on the memory cells Ca0, ..., Ck0. That is, the page buffer group 150 controls the voltages of the bit lines BL1 to $BL_k$ based on data stored in the memory cells Ca0, ..., Ck0 and detects data stored in the memory cells Ca0, ..., Ck0.

The Y decoder 160 selects the page buffers of the page buffer group 150 in response to the column address signal CADD of the controller 120. Data latched in a page buffer selected by the Y decoder 160 is outputted.

The I/O circuit 170 transfers external data to the Y decoder 160 under the control of the controller 120 so that the external data is inputted to the page buffer group 150 in a program operation. When the Y decoder 160 sequentially transfers the external data to the page buffers of the page buffer group 150, the page buffers store the external data in their internal latches. Furthermore, in a read operation, the I/O circuit 170 outputs data, received from the page buffers of the page buffer group 150 via the Y decoder 160, to the outside.

Voltage supplied to each of the word lines in the program operation of the semiconductor memory device 100 is described below.

Figure 2:
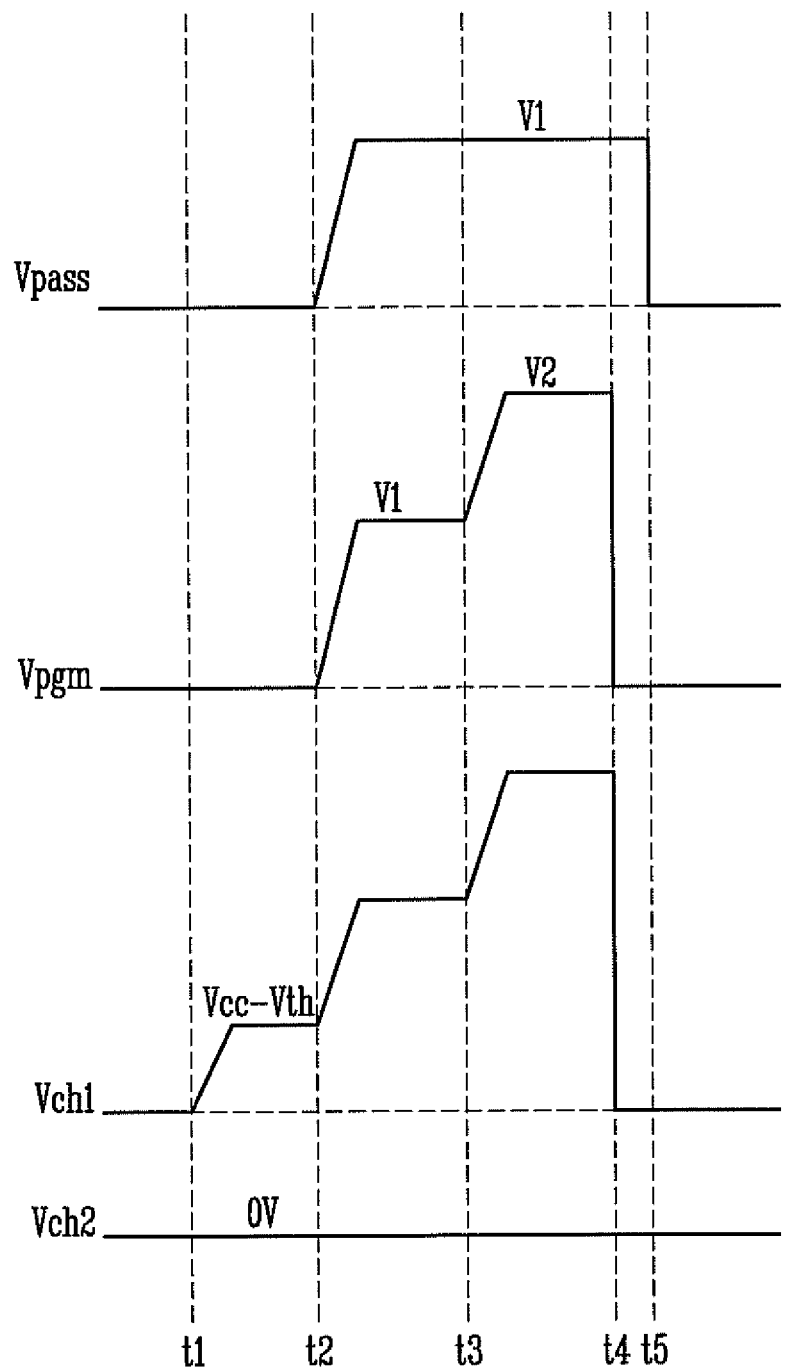
FIG. 2 is a graph showing the levels of voltages supplied to word lines in the program operation of the semiconductor memory device according to this disclosure.

FIG. 2 is a graph showing the levels of voltages supplied to word lines in the program operation of the semiconductor memory device according to this disclosure.

The program operation of the semiconductor memory device 100 is performed when a program command, an address, and data to be programmed (hereinafter referred to as program data) are received through the I/O circuit 170.

When the program signal PGM of the controller 120 is inputted to the voltage generator 130 in response to the program command, the voltage generator 130 starts generating the operating voltages for the program operation.

An operation of setting a bit line voltage is first performed, after the program data is inputted to a page buffer.

It is assumed that the bit line voltage is set during a period from a first time t1 to a second time t2 as shown in FIG. 2.

In order to set the bit line voltage, 0 V is supplied to a selected bit line and a power source voltage Vcc is supplied to the unselected bit lines in response to the address. Furthermore, the drain selection transistors are turned on, and the source selection transistors are turned off.

Accordingly, the channel voltage Vch of each of cell strings coupled to the unselected bit lines is precharged to a voltage equal to or smaller than a voltage 'Vcc−Vth'. The voltage Vth is the threshold voltage of the drain selection transistor.

Furthermore, although the cell string is coupled to a selected bit line, the channel voltage Vch1 of a cell string coupled to a memory cell to be stored program inhibition data (for example, '1'), is precharged. The channel voltage Vch2 of a cell string coupled to a memory cell to be programmed (hereinafter referred to as a program memory cell) maintains 0 V. A process of setting a bit line voltage is known in the art, and, for the sake of convenience a detailed description thereof is omitted.

The memory cells coupled to the unselected bit lines and the memory cell in which the program inhibition data will be stored are hereinafter referred to as program inhibition cells.

After the bit line voltage is set as described above, during a period from the second time t2 to a third time t3, the program voltage Vpgm is supplied to a selected word line, and the pass voltage Vpass is supplied to unselected word lines. Here, both the program voltage Vpgm and the pass voltage Vpass have a first voltage level V1. When the program voltage Vpgm and the pass voltage Vpass are supplied, the channel voltage Vch1 of each of the cell strings coupled to the program inhibition cells is boosted. Furthermore, the drain selection transistors are turned off owing to the difference between the voltage supplied to the bit line coupled to each of the drain selection transistors and the channel voltage Vch1.

At this time, the channel voltage Vch2 of the cell string coupled to the program memory cell maintains 0 V.

After the third time t3, the program voltage Vpgm rises to a second voltage level V2. Accordingly, the channel voltage Vch1 of the cell string coupled to the program inhibition cell is boosted to a higher voltage level. Here, the boosted voltage level may change depending on the semiconductor memory device 100. The program inhibition cells are not programmed because the difference between the channel voltage Vch1 and the program voltage Vpgm is small.

Furthermore, the program memory cell in which the channel voltage Vch2 maintains 0 V is programmed when the program voltage Vpgm is supplied.

As the higher pass voltage Vpass is supplied, the channel voltage Vch1 of the cell string coupled to the program inhibition cell is highly boosted. Furthermore, as the higher voltage boosting is done, the influence of program disturbance may be minimized because the difference between the program voltage Vpgm and the channel voltage Vch1 is reduced.

If the pass voltage Vpass is too high, a memory cell may be programmed by the pass voltage Vpass itself. That is, since the channel voltage Vch2 of the cell string coupled to the program memory cell maintains 0 V, if the pass voltage Vpass is too high, a pass disturbance phenomenon is generated. In the pass disturbance phenomenon, unselected memory cells within the cell string having the program memory cell, i.e., the memory cells coupled to the unselected word lines, may be programmed.

In order to reduce the program disturbance and pass disturbance phenomena, various techniques for controlling the pass voltage Vpass are being developed.

In an exemplary embodiment of this disclosure, a method of stepwise raising the pass voltage Vpass is used. Here, the highest level of the pass voltage Vpass is controlled to be equal to or lower than the first voltage level V1 shown in FIG. 2. In this case, a program disturbance phenomenon may be generated as shown in FIG. 2, but a pass disturbance phenomenon may be reduced by raising the pass voltage Vpass in a stepwise pulse form.

This will be described in detail hereinafter.

Figure 3:
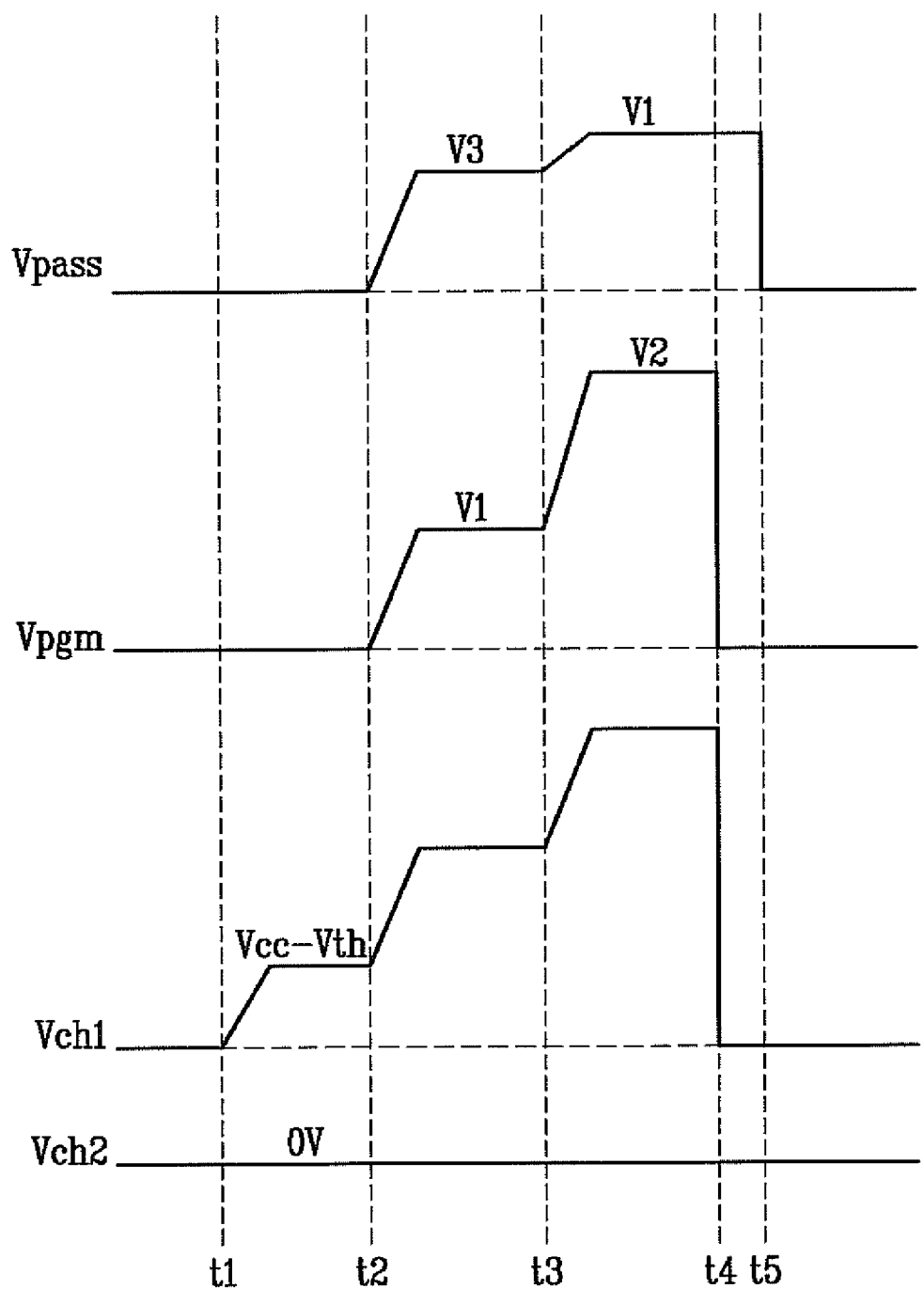
FIG. 3 is a graph illustrating the levels of voltages supplied to word lines in the program operation of the semiconductor memory device according to this disclosure.

FIG. 3 shows the levels of voltages supplied to word lines in the program operation of the semiconductor memory device according to this disclosure.

Referring to FIG. 3, an operation of setting a bit line during a first time t1 and a second time t2 are performed similar to that shown in FIG. 2.

Accordingly, the channel voltage Vch1 of each of cell strings coupled to program inhibition cells becomes 'Vcc−Vth', and the channel voltage Vch2 of a cell string coupled to a program memory cell becomes 0 V.

After the second time t2, the program voltage Vpgm is supplied to a selected word line, and the pass voltage Vpass is supplied to unselected word lines.

Here, the program voltage Vpgm having a first voltage level V1. is supplied, but the pass voltage Vpass having a third voltage level V3 is supplied. The third voltage level V3 is lower than the first voltage level V1.

After the third time t3, while the program voltage Vpgm rises to a second voltage level V2, the pass voltage Vpass rises to the first voltage level V1.

In the above method, the unselected word line is less influenced by the pass voltage Vpass.

That is, stress applied to the memory cell coupled to the unselected word line when the pass voltage Vpass having the first voltage level V1 is supplied to the unselected word line during the period from the third time t3 to the fourth time t4 is much smaller than that when the pass voltage Vpass having the first voltage level V1 is continuously supplied to the unselected word line during the period from the second time t2 to the fourth time t4 as shown in FIG. 2. Furthermore, since stress applied to the memory cell coupled to the unselected word line may be reduced, the channel voltage Vch1 of the cell string coupled to the program inhibition cell may be boosted almost identically as described in FIG. 2.

Accordingly, a program disturbance phenomenon may not change, and a pass disturbance phenomenon may be reduced.

Figure 4A:
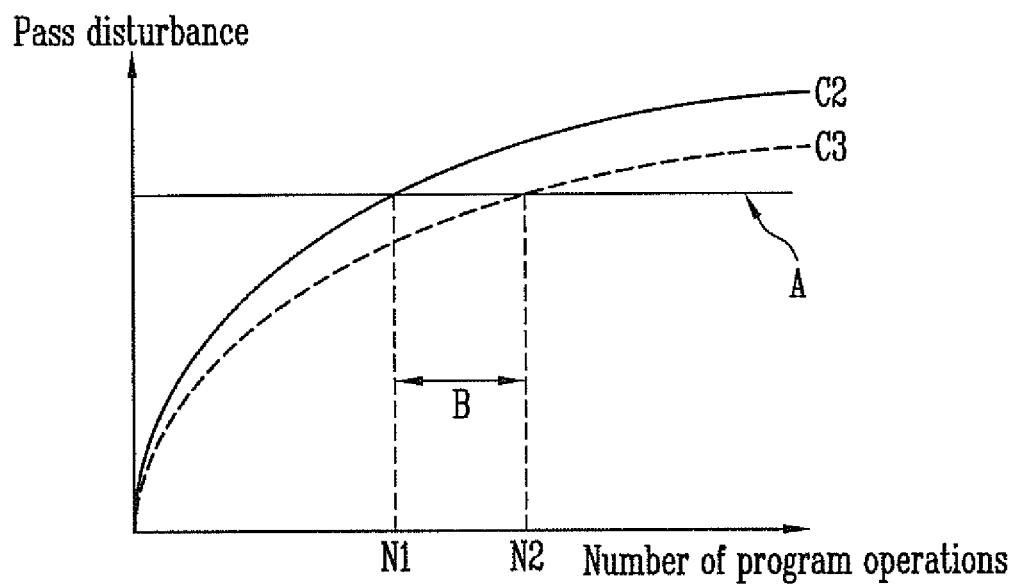
FIG. 4A is a graph illustrating pass disturbance occurring when voltage, shown in FIGS. 2 and 3 is supplied.
Figure 4B:
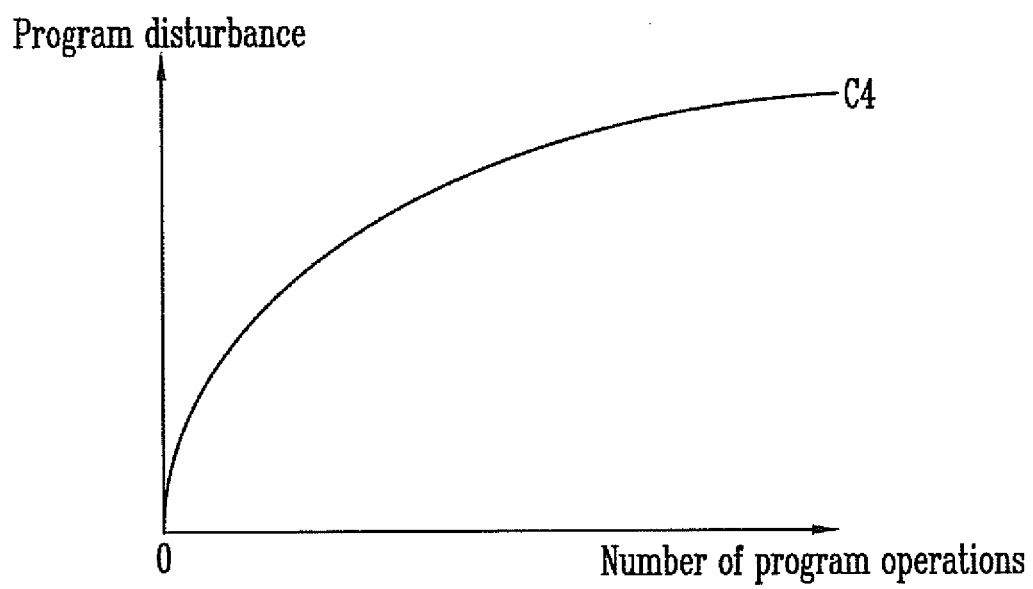
FIG. 4B is a graph illustrating program disturbance occurring when voltage shown in FIGS. 2 and 3 is supplied.

FIG. 4A is a graph illustrating a pass disturbance phenomenon occurring when voltages, as shown in FIGS. 2 and 3, are supplied, and FIG. 4B is a graph illustrating a program disturbance phenomenon occurring when voltages, as shown in FIGS. 2 and 3, are supplied. In FIG. 4A, a solid line curve denoted by C2 represents a relationship between a program disturbance and the number of program operations when voltages shown in FIG. 2 are supplied. A phantom line curve denoted by C3 represents a relationship between a program disturbance and the number of program operations when voltages shown in FIG. 3 are supplied.

From the curves C2 and C3 shown in FIG. 4A, it can be seen that, if the same number of fail bits occurring due to the pass disturbance phenomenon, or a permissible number of fail bits, is described as a solid line A, the number of program operations N1 and N2 produce the same number of fail bits and the number of program operation N1 is smaller than the number of times N2, by 'B'.

It means that the number of fail bits does not increase although the number of program operations performed as shown in FIG. 3 is increased.

In other words, in the same number of program operations, the number of fail bits occurring when the method shown in FIG. 3 is employed is smaller than that occurring when the method shown in FIG. 2 is used.

In FIG. 4B, In FIG. 4A, a solid line curve denoted by C4 represents a relationship between a program disturbance and the number of program operations when voltages shown in FIGS. 2 and 3 are supplied. Referring to the curve C4, it can be seen that the program disturbance phenomenon occurring in the program methods shown in FIGS. 2 and 3 is substantially identical to each other. That is, although the pass voltage Vpass is supplied as shown in FIG. 3, the channel voltage Vch1 of the cell string coupled to the program inhibition cell is boosted almost the same as that when the pass voltage Vpass is supplied as in FIG. 2.

In accordance with an exemplary embodiment of this disclosure, the step of supplying voltage employed in the method of supplying the pass voltage Vpass stepwise rising in the program operation may be subdivided.

Figure 5:
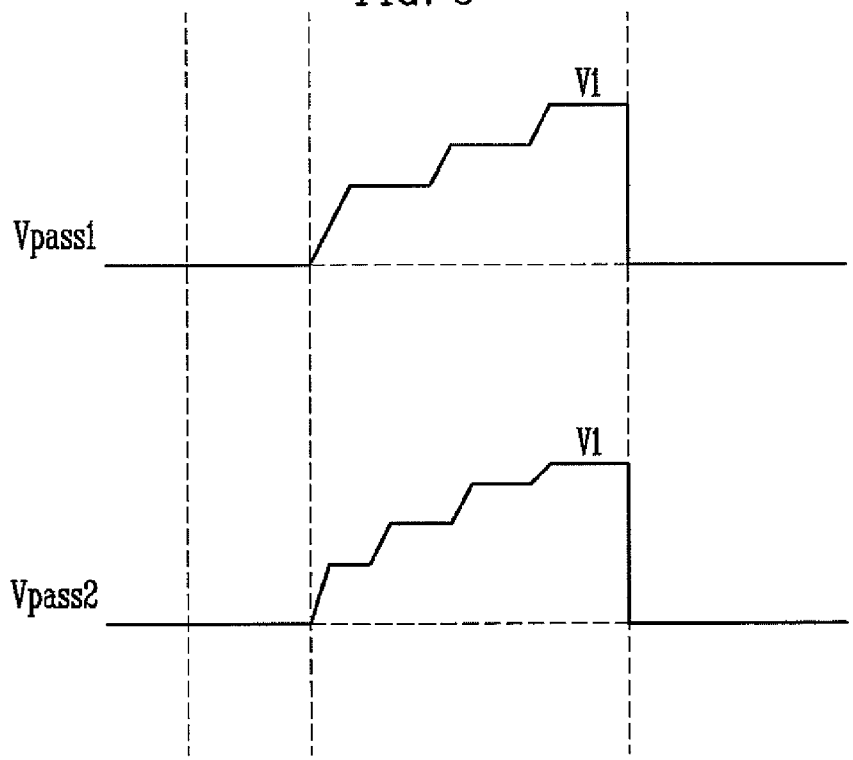
FIG. 5 is a graph illustrating a method of supplying a program pass voltage according to another exemplary embodiment of this disclosure.

That is, although the step of raising the pass voltage Vpass is subdivide into three steps or four steps as in FIG. 5, the same or similar effect as that of FIG. 3 may be obtained.

FIG. 5 is a diagram illustrating a method of supplying the program pass voltage Vpass according to another exemplary embodiment of this disclosure.

Referring to FIG. 5, a method of raising the program pass voltage Vpass in three steps as designated by using a first pass voltage Vpass1 or raising the program pass voltage Vpass in four steps as denoted by a second pass voltage Vpass2 may be used.

The final voltage level of each of the first and the second pass voltages Vpass1 and Vpass2 is the first voltage level V1. Accordingly, a program disturbance phenomenon is similar to that when the pass voltage Vpass is supplied as in FIG. 2, and a pass disturbance phenomenon may be reduced as described in FIGS. 3 and 4A.

Furthermore, the pass voltage Vpass is also used in the data read operation of the semiconductor memory device 100 shown in FIG. 1. In accordance with an exemplary embodiment of this disclosure, the pass voltage Vpass supplied to unselected word lines during the data read operation may be raised in a stepwise pulse form.

Figure 6:
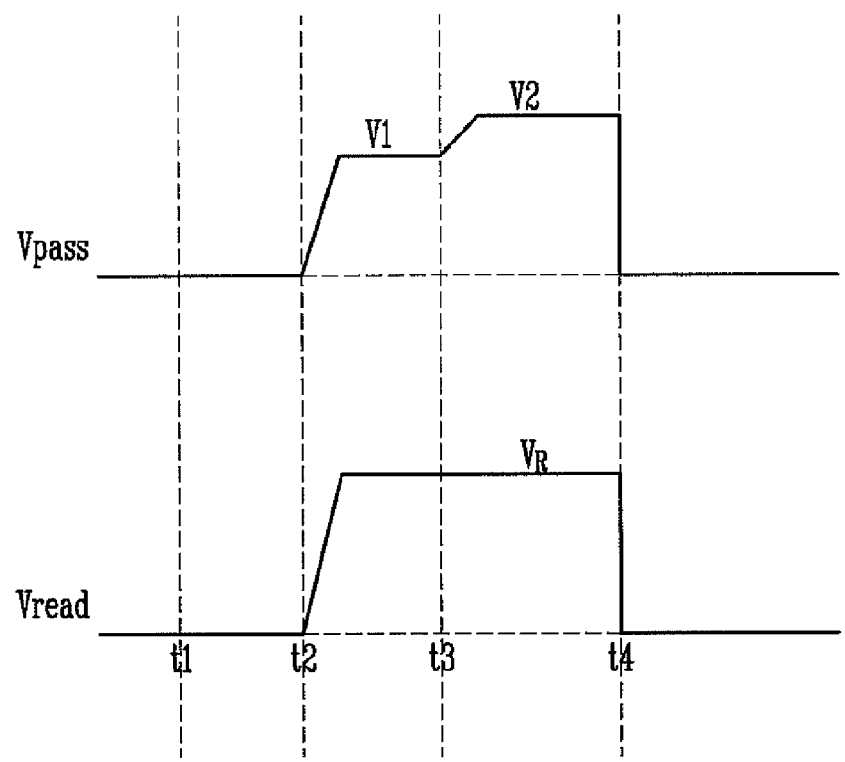
FIG. 6 is a graph illustrating a method of supplying voltages in a read operation according to yet another exemplary embodiment of this disclosure.

FIG. 6 is a diagram illustrating a method of supplying voltages in a read operation according to yet another exemplary embodiment of this disclosure.

In particular, FIG. 6 schematically shows only voltages supplied to word line in the read operation.

Referring to FIG. 6, in the read operation, the read voltage Vread having a read voltage level $V_R$ is supplied to a selected word line. Furthermore, the pass voltage Vpass is supplied to unselected word lines.

In an exemplary embodiment of this disclosure, the pass voltage Vpass is supplied to the unselected word lines in a stepwise pulse form, for example, V1 and V2 as described in FIG. 6.

That is, the pass voltage Vpass having a first voltage level V1 is supplied during a part of a period when the read voltage Vread is supplied, and the pass voltage Vpass raised from the first voltage level V1 to a second voltage level V2 is supplied during the remaining period.

More specifically, during a period when the read voltage Vread is supplied from a second time t2 to a fourth time t4, the pass voltage Vpass having the first voltage level V1 is supplied from the second time t2 to a third time t3 and the pass voltage Vpass having the second voltage level V2 is supplied from the third time t3 to the fourth time t4.

the first and the second voltage levels V1 and V2 are voltage levels capable of turning on the memory cells coupled to the unselected word lines irrespective of whether the memory cells have been programmed or not.

When the pass voltage Vpass is raised and supplied step by step during the data read operation as described above, a pass disturbance phenomenon may be reduced because stress applied to the memory cells coupled to the unselected word lines owing to the pass voltage Vpass is reduced.

In accordance with this disclosure, when the program or read operation of the semiconductor memory device is performed, the program pass voltage supplied to unselected word lines is raised step by step. Accordingly, program efficiency may be improved because a pass disturbance phenomenon may be reduced while not deteriorating a program inhibition effect.

What is claimed is:

1. A method of operating a semiconductor memory device, comprising:
   performing a read operation by supplying a read voltage to a selected word line and a pass voltage to unselected word lines in response to a read command,
   wherein the read voltage maintains a constant voltage level during a first period, and
   the pass voltage is raised to a target voltage level in a stepwise pulse form during the first period.

2. The method of claim 1, wherein the pass voltage is raised from a first voltage level to the target voltage level, and
   the first voltage level is a voltage level capable of turning on memory cells connected to the unselected word lines irrespective of whether the memory cells are programmed or not.

3. The method of claim 2, wherein the pass voltage is raised to the first voltage level from a previous voltage level, and
   a first voltage difference between the previous voltage level and the first voltage level is greater than a second voltage difference between the first voltage level and the target voltage level.

4. The method of claim 3, wherein, during a second period, the pass voltage is raised from a ground voltage level to the first voltage level and maintains the first voltage level,
   during a third period, the pass voltage is raised from the voltage level to the second voltage level and maintains the second voltage level, and
   the second period is shorter than the third period.

5. A semiconductor memory device, comprising:
   a memory cell array comprising memory cells coupled to a plurality of word lines; and
   a peripheral circuit group configured to supply a pass voltage to unselected word lines among the plurality of word lines and a read voltage to a selected word line among the plurality of word lines,
   wherein the peripheral circuit group maintains the read voltage at a constant voltage level, during a first period and stepwise raises the pass voltage supplied to the unselected word lines to a target voltage level during the first period, the peripheral circuit group raises the pass voltage from a first voltage level to the target voltage level, and the first voltage level is a voltage level capable of turning on memory cells connected to the unselected word lines irrespective of whether the memory cells are programmed or not.

6. The semiconductor memory device of claim 5, wherein the pass voltage is raised to the first voltage level from a previous voltage level, and a first voltage difference between the previous voltage level and the first voltage level is greater than a second voltage difference between the first voltage level and the target voltage level.

7. The semiconductor memory device of claim 6, wherein, during a second period, the pass voltage is raised from a ground voltage level to the first voltage level and maintains the first voltage level, during a third period, the pass voltage is raised from the first voltage level to the second voltage level and maintains the second voltage level, and the second period is shorter than the third period.

8. A semiconductor memory device, comprising:

a memory cell array comprising memory cells coupled to a plurality of word lines; and a peripheral circuit group configured to supply a pass voltage to unselected word lines among the plurality of word lines and a read voltage to a selected word line among the plurality of word lines during a data read operation, wherein the peripheral circuit group maintains the read voltage at a constant voltage level during a first period, the pass voltage includes at least two voltage levels including a first voltage level and a target voltage level increased in a stepwise pulse form during the first period, the peripheral circuit group raises the pass voltage from the first voltage level to the target voltage level, and the first voltage level is a voltage level capable of turning on memory cells connected to the unselected word lines irrespective of whether the memory cells are programmed or not.

9. The semiconductor memory device of claim 8, wherein the pass voltage is raised to the first voltage level from a previous voltage level, and a first voltage difference between the previous voltage level and the first voltage level is greater than a second voltage difference between the first voltage level and the target voltage level.

10. The semiconductor memory device of claim 9, wherein, during a second period, the pass voltage is raised from a ground voltage level to the first voltage level and maintains the first voltage level, during a third period, the pass voltage is raised from the first voltage level to the second voltage level and maintains the second voltage level, and the second period is shorter than the third period.

* * * * *